United States Patent [19]

Cook

[11] 4,396,456
[45] Aug. 2, 1983

[54] METHOD OF PEELING EPILAYERS

[76] Inventor: Melvin S. Cook, 43 Westerly Rd., Saddle River, N.J. 07458

[21] Appl. No.: 332,559

[22] Filed: Dec. 21, 1981

[51] Int. Cl.³ ............................................ C30B 33/00
[52] U.S. Cl. ......................... 156/602; 156/DIG. 105; 427/86
[58] Field of Search ............... 156/600, 602, DIG. 88, 156/DIG. 80, DIG. 105; 427/53.1, 86

[56] References Cited

U.S. PATENT DOCUMENTS

| | | | |
|---|---|---|---|
| 3,171,813 | 3/1965 | Inove | 156/602 |
| 3,585,088 | 6/1971 | Schwuttke et al. | 156/DIG. 80 |
| 4,027,053 | 5/1977 | Lesk | 156/DIG. 84 |
| 4,303,463 | 12/1981 | Cook | 156/603 |
| 4,308,078 | 12/1981 | Cook | 156/DIG. 88 |
| 4,345,967 | 8/1982 | Cook | 156/DIG. 88 |

*Primary Examiner*—Hiram H. Bernstein
*Attorney, Agent, or Firm*—Gottlieb, Rackman & Reisman

[57] ABSTRACT

A method is disclosed for peeling thin epitaxially grown crystalline layers (epilayers) from the substrates on which they have been grown. A thin layer of single-crystal is epitaxially grown on a substrate, where material at the interface of the epilayer and the substrate has a lower melting point temperature than does the epilayer. Heat is added to the lower melting point temperature material in order to liquify at least part of it. A voltage is applied between the epilayer and an adjacent structure in order to develop an electrical force on the epilayer to facilitate peeling of the epilayer away from the substrate.

3 Claims, 3 Drawing Figures

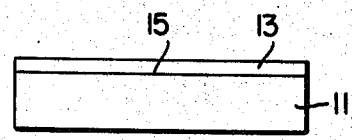
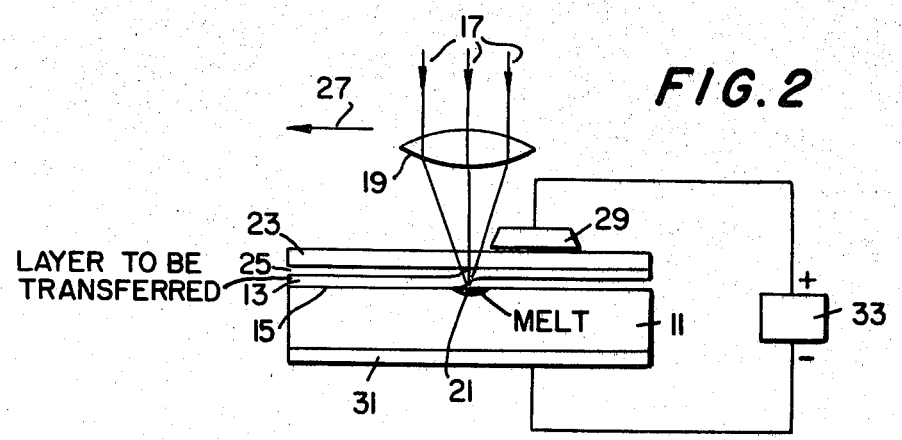
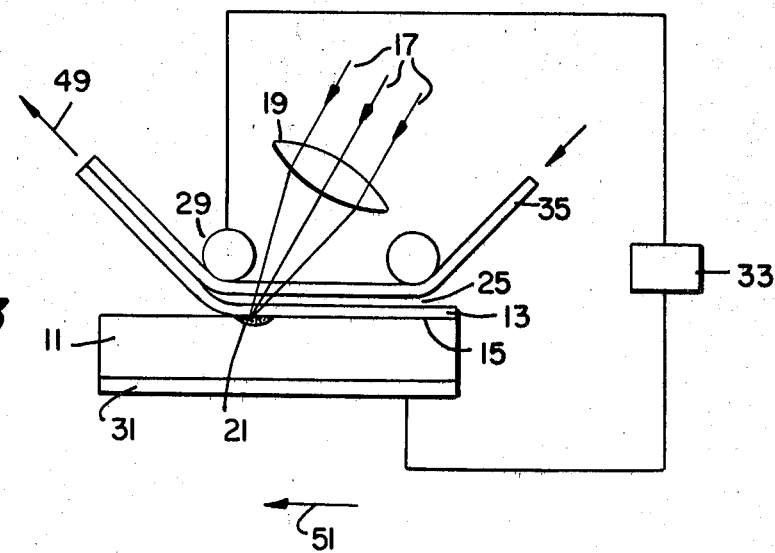

METHOD OF PEELING EPILAYERS

DESCRIPTION

This invention relates to a low-cost method of peeling epitaxially grown layers (epilayers) from the substrates on which they have been grown. It can be used, for example, to produce thin single-crystal films of semiconductors for use in making solar photovoltaic cells and in making semiconductor integrated circuits.

In my co-pending application entitled "METHOD OF PRODUCING THIN SINGLE-CRYSTAL SHEETS", Ser. No. 127,114, filed on Mar. 4, 1980, now U.S. Pat. No. 4,345,967 which application is hereby incorporated by reference, a method is disclosed for producing thin sheets of crystal; in my abandoned application entitled "METHOD OF PRODUCING THIN SINGLE-CRYSTAL SEMICONDUCTOR SHEETS WITH P-N JUNCTIONS", Ser. No. 146,104, filed on May 2, 1980, which application is hereby incorporated by reference, a method is disclosed for producing thin semiconductor sheets with surface p-n junctions formed on them; in my co-pending application entitled "METHOD OF PRODUCING SINGLE-CRYSTAL SEMICONDUCTOR FILMS BY LASER TREATMENT", Ser. No. 156,879, filed on June 6, 1980, now U.S. Pat. No. 4,308,078 which application is hereby incorporated by reference, a method is disclosed for producing thin crystals; in my co-pending application entitled "METHOD OF PEELING THIN FILMS USING DIRECTIONAL HEAT FLOW", Ser. No. 192,063, filed on Sept. 29, 1980, now U.S. Pat. No. 4,303,463 which application is hereby incorporated by reference, a method is disclosed for peeling thin layers of crystal from the substrates on which they have been grown; and in my now abandoned co-pending application entitled "METHOD OF PEELING THIN CRYSTALLINE FILMS", Ser. No. 305,521, filed on Sept. 25, 1981, which application is hereby incorporated by reference, a method is disclosed for peeling thin crystalline films from substrates on which they have been epitaxially grown.

These several applications describe the prior art and offer low-cost solutions to certain problems in that art. The methods disclosed in these several applications utilize various means for developing a liquid in the region between a layer and its substrate in order to free the layer and peel it from the substrate to form a film. However, the techniques disclosed for actually effecting the separation of the layers from their substrates may not always be the most convenient or effective for peeling the films away from the substrates. Typically, thin crystalline films are mechanically quite fragile, so that great care must be exercised in applying external forces to such films in order to separate them from their substrates, even when a liquid has been developed between the layer and the substrate.

It is an object of my present invention to provide a low-cost method of separating layers from their substrates to form films.

It is another object of my invention to provide a low-cost method of separating an epitaxially grown layer from its substrate when a region of liquified material has been developed between the layer and the substrate.

Briefly, in accordance with the principles of my invention and in the preferred embodiment thereof, a thin (e.g., a five-micrometer thick) layer of crystal is epitaxially grown on a single-crystal substrate, where material at the interface of the layer and the substrate has a lower melting point temperature than the layer. Such a layer may be grown on a substrate using techniques well-known in the art, such as chemical vapor deposition, liquid phase epitaxy, and molecular beam epitaxy. In a particular example, the epilayer may be gallium aluminum arsenide, e.g., in the proportions $Ga_{0.5}Al_{0.5}As$, and the substrate may be germanium. The melting point temperature of germanium is 937.4° Centigrade and that of the epilayer is approximately 1380° Centigrade, so that the substrate has a lower melting point temperature than does the layer at their interface.

The output beam of a laser is focused through the layer onto the substrate, preferably across the width of the substrate using laser radiation efficiently absorbed by the substrate to which the layer is transparent. In the particular example of a germanium substrate, a possible laser is a Nd:YAG laser operated at 1.06 or 1.33 microns, each of which wavelengths is absorbed by germanium but not gallium aluminum arsenide. The absorption of the laser radiation heats material at the surface of the layer and the substrate. If sufficient energy is absorbed, material will be liquified between the layer and the substrate. The presence of such liquified material allows the layer to be peeled from the substrate, while the crystalline structure of the layer remains intact.

A structure held at a higher electric potential than that of the layer is positioned near the layer. This develops a force on the layer tending to separate it from the substrate. The layer is received on a plate transparent to the laser beam, which is placed adjacent to the layer and separated from it by a small distance, e.g., 0.005 inches. If desirable, the peeled layer may later be removed from the transparent plate.

Further objects, features and advantages of my invention will become apparent upon consideration of the following detailed description in conjunction with the drawing, in which:

FIG. 1 is a schematic representation of a layer formed on a substrate;

FIG. 2 is a schematic representation of the crystalline layer (epilayer) being peeled from the substrate and received on a transparent plate; and FIG. 3 is a schematic representation of the layer being peeled from the substrate and being received on a flexible ribbon.

In FIG. 1, substrate 11 is shown with epilayer 13 formed on it. The epilayer and the substrate meet at interface 15. The epilayer material has a higher melting point temperature than does the substrate material located at the interface. Possible material combinations include gallium aluminum arsenide on germanium, and aluminum arsenide on gallium arsenide, among others.

In FIG. 2, substrate 11 is shown with epilayer 13 being peeled from it at liquified material 21. The liquified material is developed by absorption of laser radiation 17 directed by optical system 19. As the optical system moves in the direction of arrow 27, the liquified material 21 also moves in the direction 27, and the layer can be progressively removed from the substrate. The laser beam passes through receiving plate 23 positioned adjacent to the layer, but separated from it by space 25. The receiving plate may be composed of dielectrics, e.g., quartz or glass, or semiconductors, e.g., silicon or aluminum arsenide. As the layer is peeled from the substrate, it is received on the receiving plate. Electric voltage generator 33 is connected electrically between base plate 31 and offset plate 29. When the generator establishes a voltage V between the base plate and the offset plate, an electric field is established. Also, the generator causes the layer to become charged. The electric field acts on the charged layer and exerts a force on it, attracting it in the direction of the offset plate. In the region where the liquified material 21 exists, this attractive force acts to peel the layer from the substrate. When the layer is peeled away from the substrate, it moves towards and is received on the receiving plate, which then supports it mechanically. As the optical system moves, the offset plate also moves in the same direction and at the same speed. The layer is thus progressively peeled.

The means employed for moving the optical system and the offset plate, and for generating the voltage V, are not shown but any of conventional means may be employed for such purposes. The optical system and the offset plate may be included in the same physical structure since they move together. Alternatively, they may be held fixed, with the substrate and layer being moved.

If a semiconductor substrate is utilized, its electrical resistance is typically quite low at its melting point temperature. Thus, almost the full potential V appears between the layer and the offset plate. If the transparent plate 23 has a thickness t and a dielectric coefficient $k\epsilon_0$, and is separated from the layer by a space of magnitude d, there will exist a force F acting on the layer which is equal to:

$$F = 8.85 \times 10^{-12} (kV)^2/(kd+t)^2 \text{ Newtons/square meter.}$$

In the particular case where $k=5$, $d=10^{-3}$ meters, $t=10^{-3}$ meters, and $V=4\times 10^3$ volts, the value of F is 980 dynes/cm$^2$.

If transparent plate 23 is made of silicon, a Nd:YAG laser operated at 1.33 microns can be used.

In FIG. 3, substrate 11 is shown with layer 13 being peeled from it at liquified material 21. The liquified material is developed by absorption of laser radiation 17 directed by optical system 19. An electric field acts on the layer at the region of the liquified material. This field is established by voltage generator 33 connected between offset plate 29 and base plate 31. When the field is sufficiently strong to peel the layer from the substrate, the layer moves to the flexible ribbon 35, which supports it and moves it away from the substrate in the direction 49. The ribbon may be composed of a dielectric material such as Teflon or glass, a semiconductor material such as silicon or aluminum arsenide, or a metallized material such as silvered Teflon or silvered glass, among others. The means employed to move the ribbon are not shown, but any of conventional means may be employed for such purpose. The substrate is moved in the direction of arrow 51 as the layer is progressively peeled from the substrate. In a particular case of a metallized ribbon with the dielectric side of the ribbon facing the layer, the dielectric thickness may be $5\times 10^{-4}$ meters, the separation of the ribbon from the layer may be $5\times 10^{-4}$ meters, and the dielectric coefficient of the dielectric may be $3\epsilon_0$, so that $F=2\times 10^{-4} V^2$, and if $V=2\times 10^3$ volts, $F=800$ dynes/cm$^2$.

The same separation technique can be used to fabricate a multi-junction cascade solar cell. A first pn junction can be formed on a silicon substrate which is then used as plate 23 in FIG. 2, with the transferred, peeled, layer comprising a second pn junction (or a multi-junction) structure.

Instead of utilizing a separate plate 29 as in FIG. 2, a conductive grid may be formed on that side of receiving plate 23 which faces the laser radiation, with voltage generator 33 being connected to the grid. The grid may be formed of a network of linear conductive deposits, e.g., of aluminum, copper and nickel, in a substantially open arrangement. Alternatively, the grid may be a continuous layer of material which is substantially transparent to the radiation, such as tin oxide.

Although the source of the heat energy used to liquify material at the interface of the layer and the substrate has been illustrated as being a laser, it will be apparent to one skilled in the art and familiar with my aforesaid applications that other sources of heat energy may be used. Thus, while the principles of the invention have been illustrated in connection with specific embodiments, it is to be understood that this description has been made only by way of example and not as a limitation to the scope of the invention as set forth in the accompanying claims.

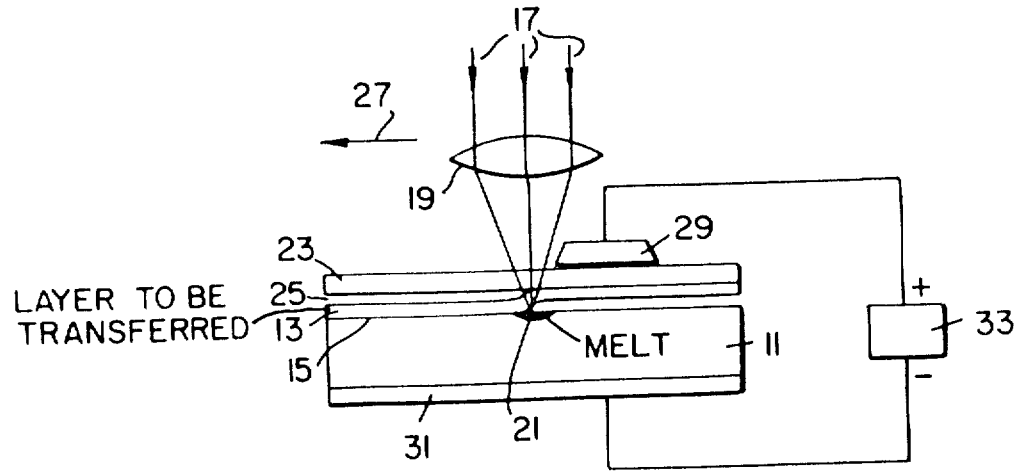

I claim:

1. A method of peeling a crystalline layer from a substrate, material at the interface of said substrate and said crystalline layer having a lower melting point temperature than that of said crystalline layer, comprising the steps of heating said material at said interface such that at least part of said material at said interface liquifies, and peeling said crystalline layer from said substrate at said liquified material by developing an electric force on said crystalline layer at the region of said liquified material.

2. A method in accordance with claim 1 wherein said electric force is developed by an electric field acting on said crystalline layer.

3. A method in accordance with claim 2 wherein said electric field is developed by connecting an electric field generator between said substrate and an electrically conductive structure positioned adjacent to but separated from said crystalline layer at said liquified material.

* * * * *

UNITED STATES PATENT AND TRADEMARK OFFICE
CERTIFICATE OF CORRECTION

PATENT NO. : 4,396,456

DATED : August 2, 1983

INVENTOR(S) : Melvin S. Cook

It is certified that error appears in the above-identified patent and that said Letters Patent is hereby corrected as shown below:

The title page should be deleted to appear as per attached title page.

Signed and Sealed this

Eighteenth Day of October 1983

[SEAL]

Attest:

GERALD J. MOSSINGHOFF

Attesting Officer

Commissioner of Patents and Trademarks

United States Patent [19]

Cook

[11] 4,396,456
[45] Aug. 2, 1983

[54] METHOD OF PEELING EPILAYERS

[76] Inventor: Melvin S. Cook, 43 Westerly Rd., Saddle River, N.J. 07458

[21] Appl. No.: 332,559

[22] Filed: Dec. 21, 1981

[51] Int. Cl.³ .............................................. C30B 33/00
[52] U.S. Cl. .................... 156/602; 156/DIG. 105; 427/86
[58] Field of Search ............ 156/600, 602, DIG. 88, 156/DIG. 80, DIG. 105; 427/53.1, 86

[56] References Cited

U.S. PATENT DOCUMENTS

| | | | |
|---|---|---|---|
| 3,171,813 | 3/1965 | Inove | 156/602 |
| 3,585,088 | 6/1971 | Schwuttke et al. | 156/DIG. 80 |
| 4,027,053 | 5/1977 | Lesk | 156/DIG. 84 |
| 4,303,463 | 12/1981 | Cook | 156/603 |
| 4,308,078 | 12/1981 | Cook | 156/DIG. 88 |
| 4,345,967 | 8/1982 | Cook | 156/DIG. 88 |

Primary Examiner—Hiram H. Bernstein
Attorney, Agent, or Firm—Gottlieb, Rackman & Reisman

[57] ABSTRACT

A method is disclosed for peeling thin epitaxially grown crystalline layers (epilayers) from the substrates on which they have been grown. A thin layer of single-crystal is epitaxially grown on a substrate, where material at the interface of the epilayer and the substrate has a lower melting point temperature than does the epilayer. Heat is added to the lower melting point temperature material in order to liquify at least part of it. A voltage is applied between the epilayer and an adjacent structure in order to develop an electrical force on the epilayer to facilitate peeling of the epilayer away from the substrate.

3 Claims, 3 Drawing Figures